US012716961B2

(12) United States Patent
Kovacevic et al.

(10) Patent No.: US 12,716,961 B2
(45) Date of Patent: Aug. 25, 2026

(54) REAL TIME LIVE LINE MEASUREMENT OF METROLOGICAL PROPERTIES OF VOLTAGE TRANSFORMERS

(71) Applicants: Uros Kovacevic, Belgrade (RS); Vladeta Milenkovic, Niš (RS)

(72) Inventors: Uros Kovacevic, Belgrade (RS); Vladeta Milenkovic, Niš (RS)

( * ) Notice: Subject to any disclaimer, the term of this patent is extended or adjusted under 35 U.S.C. 154(b) by 164 days.

(21) Appl. No.: 18/840,655

(22) PCT Filed: Feb. 27, 2023

(86) PCT No.: PCT/EP2023/054869
§ 371 (c)(1),
(2) Date: Aug. 22, 2024

(87) PCT Pub. No.: WO2023/161486
PCT Pub. Date: Aug. 31, 2023

(65) Prior Publication Data

US 2025/0172634 A1 May 29, 2025

(30) Foreign Application Priority Data

Feb. 28, 2022 (GB) ..................................... 2202737

(51) Int. Cl.
*G01R 31/62* (2020.01)
*G01R 15/04* (2006.01)
(Continued)

(52) U.S. Cl.
CPC ......... *G01R 31/62* (2020.01); *G01R 19/0084* (2013.01); *G01R 35/005* (2013.01); *G01S 19/13* (2013.01)

(58) Field of Classification Search
CPC ........ G01R 31/02; G01R 31/14; G01R 31/56; G01R 31/62; G01R 15/04; G01R 15/14;
(Continued)

(56) References Cited

U.S. PATENT DOCUMENTS

2008/0077336 A1 3/2008 Fernandes
2010/0188240 A1 7/2010 Wells
(Continued)

FOREIGN PATENT DOCUMENTS

FR 2998060 A1 * 5/2014 ........... G01R 15/183
GB 2598564 A 3/2022
RO 134712 A 6/2020

OTHER PUBLICATIONS

International Search Report and Written Opinion dated Jun. 2, 2023 from corresponding International Patent Application No. PCT/EP2023/054869, 16 pages.
(Continued)

*Primary Examiner* — Neel D Shah
(74) *Attorney, Agent, or Firm* — Ruggiero McAllister & McMahon LLC

(57) ABSTRACT

A real time live line method analyses metrological properties of a high voltage voltage transformer configured to transform an upstream voltage into a downstream voltage. The method comprises obtaining a series of upstream voltage data points during a first time period using an upstream voltage sensor; and attributing an upstream time stamp provided by an upstream global navigation satellite system—GNSS—signal receiver to each one of the series of upstream voltage data points to obtain a time-stamped series of upstream voltage data points. The method further comprises: obtaining a series of downstream voltage data points during the first time period using a downstream voltage sensor; and attributing a downstream time stamp provided by a downstream global navigation satellite system—GNSS—signal receiver to each one of the series of downstream voltage data points to obtain a time-stamped series of downstream voltage data points. The method further comprises: calculating a voltage transformer phase displacement error between the time-stamped series of upstream voltage
(Continued)

data points and the time-stamped series of downstream voltage data points; and calculating a voltage transformer ratio error by comparing a rated ratio of the voltage transformer with a measured ratio determined using the time-stamped series of upstream voltage data points and the time-stamped series of downstream voltage data points.

13 Claims, 8 Drawing Sheets

(51) Int. Cl.

| | |
|---|---|
| ***G01R 15/14*** | (2006.01) |
| ***G01R 15/16*** | (2006.01) |
| ***G01R 15/18*** | (2006.01) |
| ***G01R 19/00*** | (2006.01) |
| ***G01R 21/133*** | (2006.01) |
| ***G01R 31/02*** | (2006.01) |
| ***G01R 31/14*** | (2006.01) |
| ***G01R 31/56*** | (2020.01) |
| ***G01R 35/00*** | (2006.01) |
| ***G01S 19/13*** | (2010.01) |

(58) Field of Classification Search
CPC ...... G01R 15/16; G01R 15/18; G01R 21/133; G01R 35/00; G01S 19/13
See application file for complete search history.

(56) References Cited

U.S. PATENT DOCUMENTS

2014/0114731 A1 4/2014 Wright
2018/0059144 A1 3/2018 Davis

OTHER PUBLICATIONS

Great Britain Combined Search and Examination Report dated Aug. 15, 2022 from corresponding GB Application No. 2202737.9, 6 pages.

* cited by examiner

REAL TIME LIVE LINE MEASUREMENT OF METROLOGICAL PROPERTIES OF VOLTAGE TRANSFORMERS

CROSS-REFERENCE TO RELATED APPLICATION

This application is a national stage of International Application No. PCT/EP2023/054869, filed on Feb. 27, 2023, which claims priority to United Kingdom Application No. 2202737.9, filed on Feb. 28, 2022, both of the aforementioned applications are hereby incorporated by reference in their entireties.

FIELD OF THE DISCLOSURE

A method and associated apparatus for obtaining real time live line measurement of metrological properties of voltage transformers is disclosed.

BACKGROUND

Metrological properties of voltage transformers, especially those for use with medium and high voltages like those in use in electric power systems and in electricity substations, can deteriorate with age and use. It is helpful to be able to test metrological properties of voltage transformers to ensure that they are within acceptable limits and to identify those that are outside acceptable limits.

It is known to test metrological properties of voltage transformers when the transformers are out of use. Such tests may require disconnection of the voltage transformer from the power network, unbundling of conductors and in most cases the consequential interruption in the delivery of electricity. In short, it is disruptive and costly to take a voltage transformer out of use. Moreover, since such tests that take place with the voltage transformer out of use, they are unable to test the voltage transformer in real operating conditions at high voltages and currents, and secondary burdens.

SUMMARY OF THE DISCLOSURE

Against this background, in a first aspect of the disclosure there is provided an online live line method of analysing metrological properties of voltage transformer for high voltage applications configured to transform an upstream voltage into a downstream voltage, the method comprising:

- obtaining a series of upstream voltage data points during a first time period using an upstream voltage sensor;
- attributing an upstream time stamp provided by an upstream global navigation satellite system (GNSS) signal receiver to each one of the series of upstream voltage data points to obtain a time-stamped series of upstream voltage data points;
- obtaining a series of downstream voltage data points during the first time period using a downstream voltage sensor;
- attributing a downstream time stamp provided by a downstream global navigation satellite system (GNSS) signal receiver to each one of the series of downstream voltage data points to obtain a time-stamped series of downstream voltage data points;
- calculating a voltage transformer phase displacement error between the time-stamped series of upstream voltage data points and the time-stamped series of downstream voltage data points;

- calculating a voltage transformer ratio error by comparing a rated ratio of the voltage transformer with a measured ratio determined using the time-stamped series of upstream voltage data points and the time-stamped series of downstream voltage data points.

In this way, metrological properties of the voltage transformer under test may be obtained while the voltage transformer is in use using standard low-cost voltage sensors. This removes a need for the transformer to be taken out of use in order to be tested, which in turn may increase the feasibility of more frequent testing. Furthermore, the use of GNSS time stamp data facilitates a degree of time measurement accuracy within less than 100 ns, potentially as low as 10 ns.

In this way, there is a relatively low cost and complexity of hardware required at the voltage transformer location. The calculations of phase displacement and transformer ratio error can be performed remotely.

In some embodiments, the measured ratio may be a ratio of:

- a root mean square value of the series of upstream data points; to
- a root mean square value of the series of downstream data points.

In this way, straightforward mathematical operations may be performed on the data to achieve the measured ratio and thereby the transformer ratio error.

The voltage transformer phase displacement error may be proportional to a time difference between at least one pair of successive zero crossings of time stamped upstream voltage data and time stamped downstream voltage data, wherein accuracy of time reference is less than 100 nanoseconds and preferably approximately 10 nanoseconds.

The stream of upstream voltage data points and the stream of downstream voltage data points comprises at least 20,000 data points per AC cycle, preferably 40,000 data points per AC cycle.

The method may further comprise compensating for measurement errors derived via a calibration process.

The method may further comprise compensating for measurement errors derived via a calibration process.

In this way, known errors in the measurement apparatus can be removed from the results.

The calibration process may comprise:

- using the upstream voltage sensor to sense a voltage at high voltage conductor of a calibration circuit;
- using the downstream voltage sensor to a sense a voltage at low voltage side of the calibration circuit,
- wherein the calibration circuit comprises a standard high voltage transformer with a transformation ratio accuracy rating of at least 0.05%;
- thereby to determine ratio error and phase displacement error arising from the pairing of the upstream and downstream voltage sensors.

The method may further comprise a step of removing error values determined via the calibration process from measured data of the voltage transformer under test in order to achieve corrected data values, wherein optionally the step of removing error values is carried out by a cloud server.

The method may further comprise one or both of:

- hot stick mounting the upstream voltage sensor on an upstream conductor upstream of the voltage transformer, including the provision of electro-magnetic shielding to protect the upstream voltage sensor;
- hot stick mounting the downstream voltage sensor on a downstream conductor downstream of the voltage transformer, including the provision of electro-magnetic shielding to protect the downstream voltage sensor.

In a second aspect of the disclosure, there is provided an electrical measurement apparatus for online live line analysis of metrological properties of a voltage transformer, the apparatus comprising:

a primary sensing module comprising:
- a primary sensor configured to measure a primary voltage at a primary conductor of a voltage transformer in order to obtain a series of primary voltage data points; and
- a primary global navigation satellite system (GNSS) signal receiver configured to attribute a primary GNSS time stamp to each one of the series of primary voltage data points to obtain a primary series of time stamped data points; and a secondary sensing module comprising:
- a secondary sensor configured to measure a secondary voltage between the secondary conductors of the voltage transformer in order to obtain a series of secondary voltage data points; and
- a secondary GNSS signal receiver configured to attribute a secondary GNSS time stamp to each one of the series of secondary voltage data points to obtain a secondary series of time stamped data points;

wherein the primary sensing module is configured to transmit the primary series of time stamped data points to the secondary sensing module; and wherein the secondary sensing module is configured:
- to receive the primary series of time stamped data points;
- to generate aggregated data comprising both the primary series of time-stamped data points and the secondary series of time-stamped voltage data points; and
- to output the aggregated data.

In this way, the hardware required at the voltage transformer location is relatively low cost and low complexity. The calculations of phase displacement and transformer ratio error can be performed remotely.

The primary sensing module may be configured to be hot stick mounted on an energized high voltage conductor, to sense a higher voltage than the secondary sensing module.

The primary sensing module may comprise electromagnetic shielding.

The secondary sensing module may comprise electromagnetic shielding.

The primary sensing module may comprise a primary wireless transmitter configured to transmit the primary series of time stamped data points to the secondary sensing module.

The secondary sensing module may comprise a secondary wireless receiver configured to receive the primary series of time stamped data points from the secondary sensing module.

The secondary sensing module may comprise a secondary wireless transmitter configured to transmit the aggregated data and/or to transmit the ratio error and the phase displacement error.

BRIEF DESCRIPTION OF THE DRAWINGS

Embodiments of the disclosure are now described with reference to the following figures.

DETAILED DESCRIPTION

Figure 1:
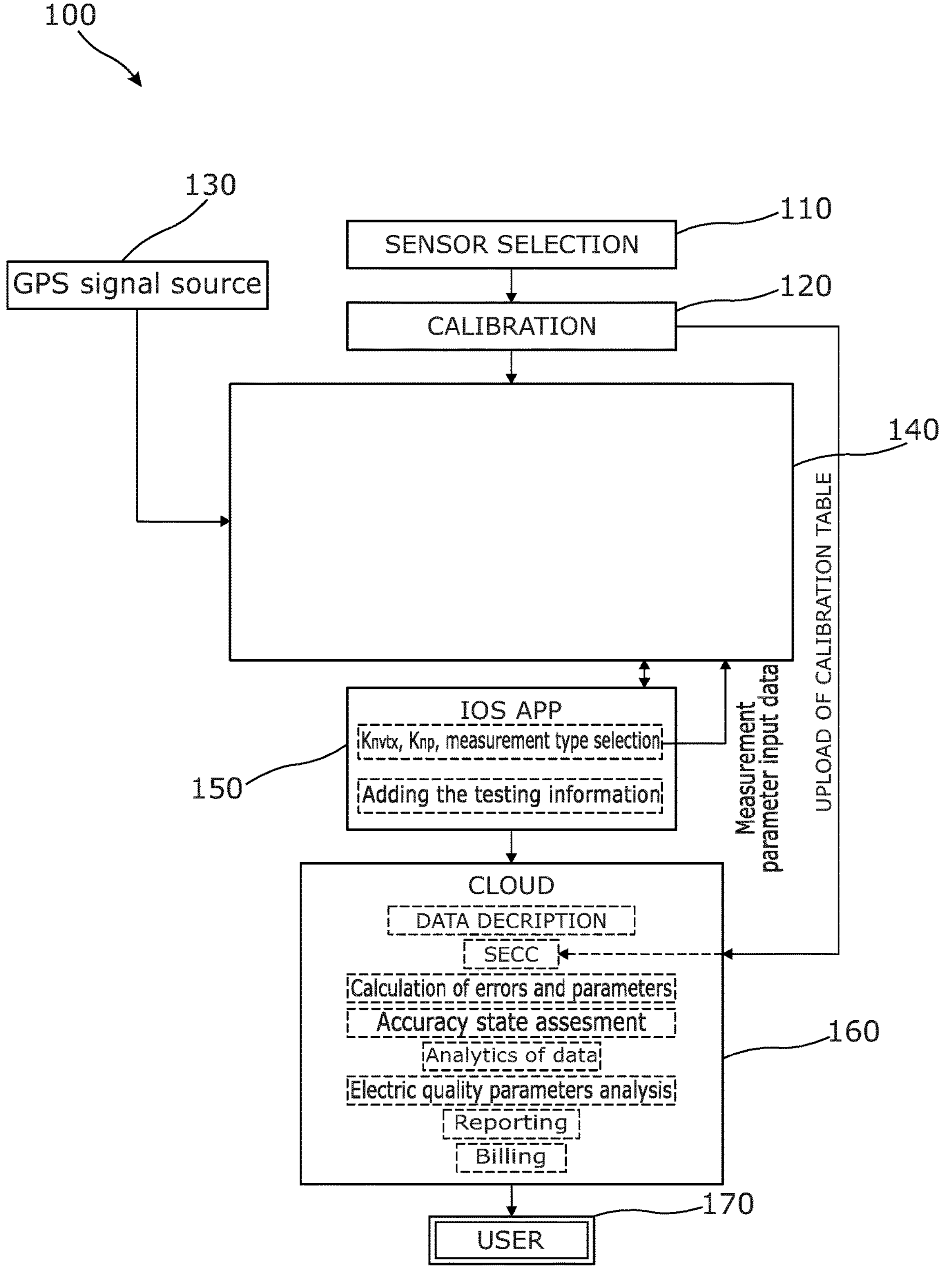
FIG. 1 is a high level flow chart showing aspects of the method of the disclosure.

A high level schematic representation of the method 100 of the disclosure is set out in FIG. 1.

The method 100 comprises a step of sensor selection 110. In particular, it comprises selection of an appropriate upstream voltage sensor 431 for sensing voltage in an upstream conductor that is upstream of the voltage transformer (VTx) 400 under test. It also comprises selection of an appropriate downstream voltage sensor 441 for sensing voltage in a downstream conductor that is downstream of the voltage transformer 400 under test. In each case the sensor 431, 441 needs to be appropriate to the geometry of the relevant conductor and appropriate to the magnitude of the voltage at the relevant conductor.

At step 120, a calibration process is performed. This is explained in more detail below. It is necessary for the calibration process to take place for the specific pair of sensing modules 430, 440 that have been selected. How frequently calibration is performed will depend on multiple factors.

At step 130 a signal is received from a global navigation satellite system (GNSS), such as a global positioning system (GPS™) 450. The signal comprises highly accurate and precise time information which enables a precise and accurate time, to within 10 ns, to be attributed to events.

At step 140, measurement is performed by each of the two sensing modules 430, 440. The measurement steps are set out in more detail at FIG. 2. For each sensing module 430, 440, a large number of voltage readings is taken and each reading is attributed a precise time stamp, as provided by the GNSS signal.

In a first option, one voltage sensing module (either that configured to measure the upstream voltage or that configured to measure the downstream voltage 430, 440) may be configured to transmit its time-stamped data points to the other voltage sensing module 440, 430. The voltage sensing module that receives 440, 430 may then be configured to package the time-stamped data points from both the upstream and the downstream voltage sensing modules 430, 440 and output the aggregated data.

In preferred implementations of the first option, the voltage sensing module that receives and aggregates the data is the voltage sensor configured to measure the lower of the two voltages 440. This is because a higher voltage is likely to generate greater electromagnetic interference than a lower voltage. Therefore, it may be appropriate to carry out fewer functions in the location of higher electromagnetic interference and to carry out more functions in the location on low voltage, and of lower electromagnetic interference.

In a second option, instead of sending data from one voltage sensing module to the other, all time-stamped data may be sent for processing from the voltage sensing modules 340, 440 to a processor independent of the voltage sensing modules, such as a so-called edge gateway device 600, a mobile device 370 of a user, or to the cloud server 360 for processing.

Returning to FIG. 1, the aggregated data is used in the calculation of voltage transformer ratio error $\varepsilon_{VTx}$ and voltage transformer phase displacement error $\varphi_{VTx}$ between a high voltage side and a low (medium) voltage side. The calculations may be performed locally on one of the voltage sensing modules (as in the FIG. 1 example) or transmitted to an independent processor (such as a cloud server) 160.

Calculation of the voltage transformer ratio error $\varepsilon_{VTx}$ and voltage transformer phase displacement error $\varphi_{VTx}$ also requires additional information related to the type of test. This information may be provided by a user, perhaps using an app 150 on a mobile device 370 as shown in FIG. 1. The information provided by the user may be provided back to the primary and secondary voltage sensing modules 430, 440 as well as onward to a processor.

This information will include the details of the voltage transformer VTx under test and details of the type of test, including the following:

- $k_{nVTx}$—rated transformation ratio of the voltage transformer under test
- $K_{np}$—rated transformation ratio of the sensor measurement type, including:
  - number of measurements,
  - time interval of measurements,
  - mode of measurement (slow/fast)

$k_{nVTx}$ and $k_{np}$ are used to select the appropriate calibration table as well as for calculating of $\varepsilon_{vtx}$ and $\varphi_{vtx}$.

Ratio error ε is defined as:

$$\varepsilon = \frac{k_n * V_s - V_p}{V_p} 100\,(\%)$$

Phase displacement error φ is defined as:

$$\varphi = 2\pi f\,(t_{0s} - t_{0p})$$

where:

- $k_n$ is rated transformation ratio ($k_n = V_{pn}/V_{sn}$),
- $V_{pn}$, $V_{sn}$ are rated values of the primary and secondary voltages, respectively,
- $V_p$, $V_s$ are effective values (true RMS) of primary and secondary voltage, respectively,
- f is fundamental power frequency of the voltage in the network (50 Hz or 60 Hz),
- $t_{0p}$ and $t_{0s}$ are successive zero crossing time (point) of primary and secondary voltage, respectively.

$$v = \frac{V_p}{V_{pn}} (r.u.) \text{ relative voltage}$$

Error compensation and correction may also be performed (in the FIG. 1 embodiment this is performed in the cloud 160), as explained further below.

Figure 2:
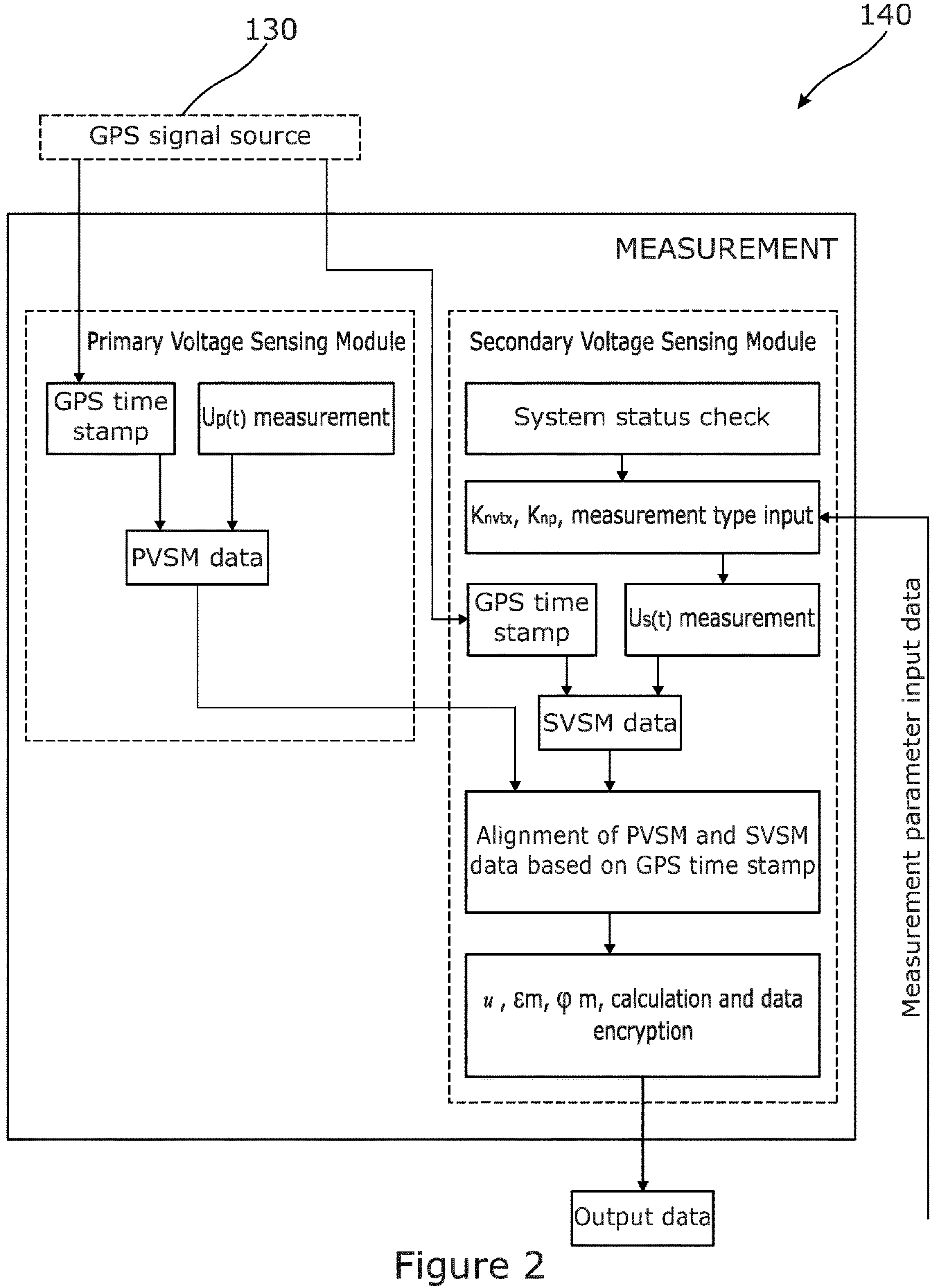
FIG. 2 shows in more detail the measurement cell of the flow chart of FIG. 1.
Figure 3:
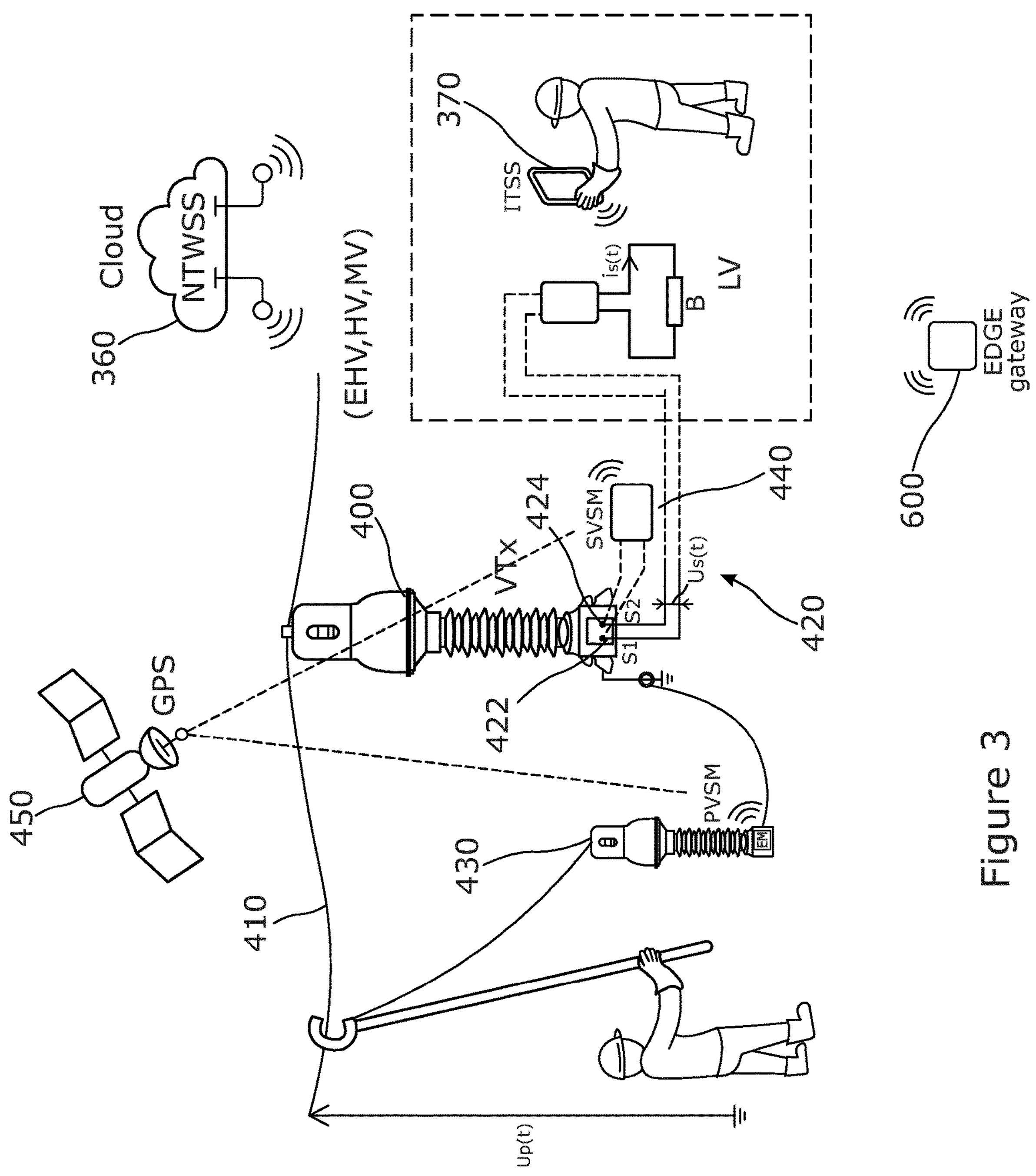
FIG. 3 shows aspects of apparatus in accordance with the present disclosure in situ relative to a voltage transformer under test for performing the method of the disclosure.

FIG. 3 shows a schematic diagram of a collection of apparatus for carrying out the method set out schematically in FIGS. 1 and 2.

In the FIG. 3 arrangement, the voltage transformer VTx 400 under test is configured to transform an upstream voltage Up(t) (between an upstream conductor 410 and ground) into a downstream voltage Us(t) (between a first conductor 422 and a second conductor 424 forming a downstream circuit 420).

The upstream conductor may be part of a longer distance power network at a medium or high voltage and high current. The downstream conductor may be for local supply, a shorter distance at low voltage and at a lower current, such as in the context of power meters, protective relays, SCADA systems, PMU system. The high voltage may be of the order of between 1 kV and 1000 of kV. The low voltage may be of the order of 100V or 100/√3 V, 110V, 110√3 V, 200V, 200/√3 V or similar.

An upstream voltage sensing module 430 is attached between the upstream conductor 410 and ground. A downstream voltage sensing module 440 is attached between a first conductor 422 and a second conductor 424 forming a downstream circuit 420.

A signal from a GNSS (such as a GPS 450) is received, separately, by the upstream voltage sensing module 430 and the downstream voltage sensing module 440. In this way, the voltage data values sensed by the upstream voltage sensing module 430 and by the downstream voltage sensing module 440 are each independently attributed a highly accurate time stamp provided by the GNSS signal.

The time-stamped upstream voltage data values from one of the primary voltage sensing module 430 and the secondary voltage sensing module 440 may be transmitted to the other of the primary voltage sensing module 430 and the secondary voltage sensing module 440. The receiving voltage sensing module aggregates the time-stamped upstream voltage data values and the time-stamped downstream voltage data values and either processes them locally to determine ratio and phase displacement errors, or transmits them onward to a processor which may be based in the cloud 360 to perform the calculations.

(It is not necessarily the case that the primary voltage sensing module senses the upstream voltage and that the secondary voltage sensing module senses the downstream voltage. If the voltage transformer were transforming from a lower voltage to a higher voltage, it may be that the primary voltage sensing module senses the downstream voltage and the secondary voltage sensing module senses the upstream voltage. The term secondary voltage sensing module may be used to refer to the voltage sensing module (whether upstream or downstream) that receives data from the primary voltage sensing module and aggregates both the primary voltage sensing module data and the secondary voltage sensing module data.)

It is likely that the voltage sensing module configured to measure the lower voltage side of the voltage transformer is the one that will be the secondary voltage sensing module. This is because it is further from the electric fields associated with the higher voltage conductor and may therefore require less electromagnetic shielding of the electronic components, including those associated with sending and receiving wireless signals, as discussed further below.

Figure 4:
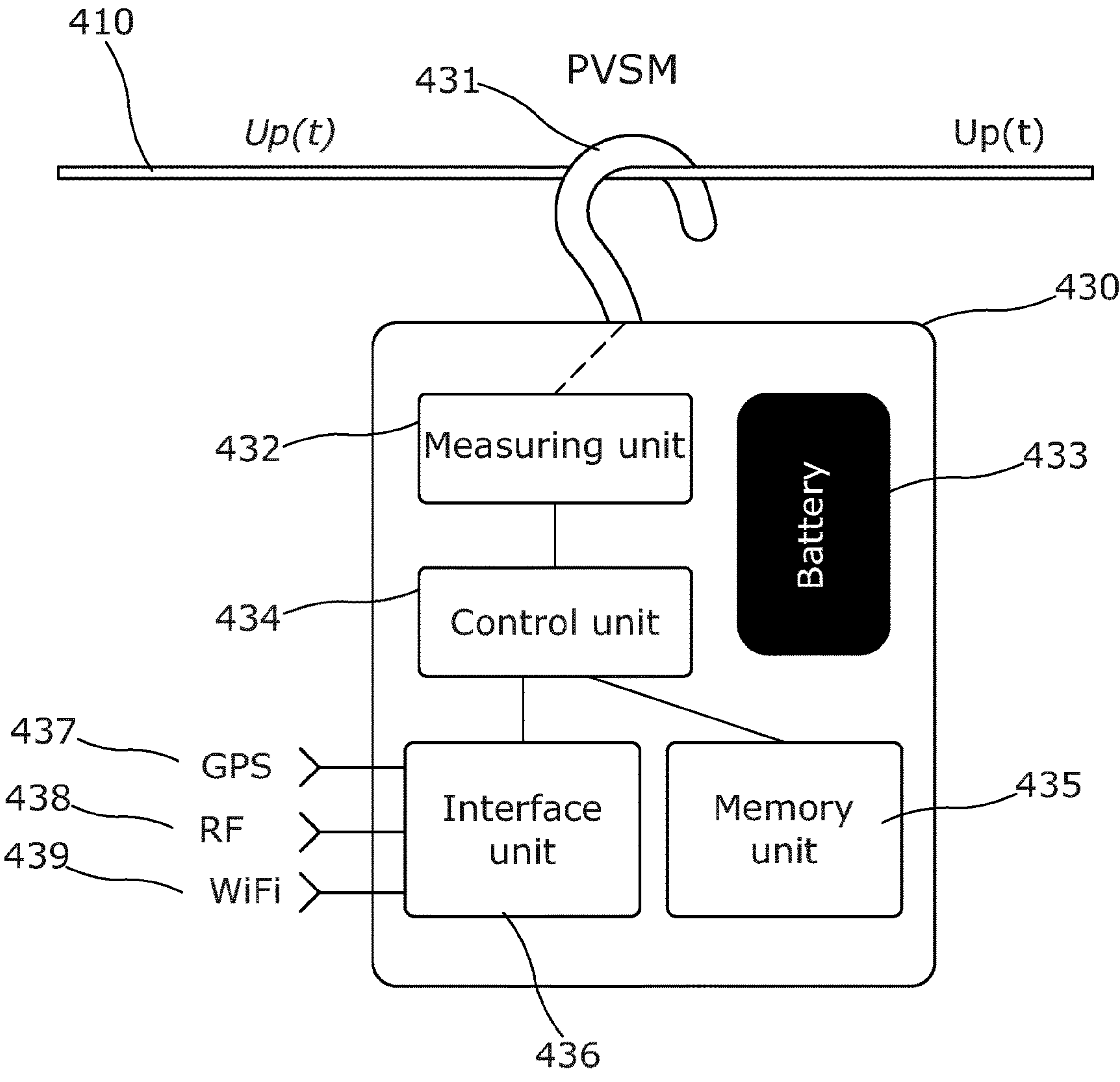
FIG. 4 shows a schematic representation of a primary sensing module for sensing a voltage.

FIG. 4 shows a high level schematic view of the features of the primary voltage sensing module 430. The primary voltage sensing module 430 may comprise a sensor 431, a measuring unit 432, a battery 433, a control unit 434, a memory unit 435 and an interface unit 436. The interface unit 436 may comprise a GNSS interface apparatus 437, a radio frequency (RF) interface apparatus 438 and a WiFi apparatus 439. The GNSS interface apparatus 437 may be configured to receive the GNSS data, including the time stamp data. The measuring unit 432 may be configured to obtain analogue voltage data from the sensor 431 and digitize the data to produce digitized voltage data. The control unit 434 may be configured to ensure that each digitized voltage data is attributed with the time-stamp provided via the GNSS interface apparatus 437. The RF interface apparatus 438 may be configured to transmit the time-stamped voltage data to the secondary voltage sensing module 440.

Figure 5:
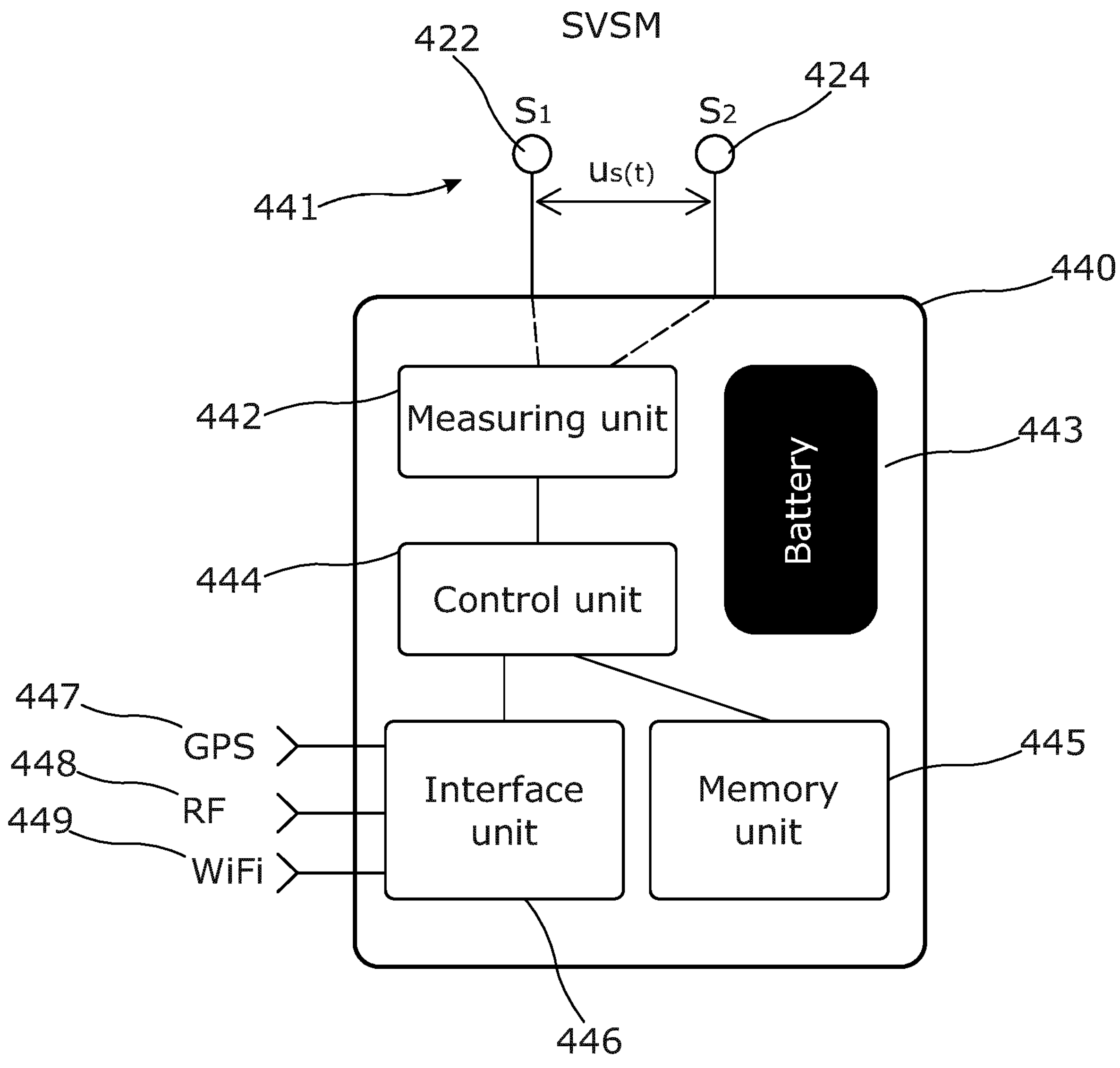
FIG. 5 shows a schematic representation of a secondary sensing module for sensing a voltage.

FIG. 5 shows a high level schematic view of the features of the secondary voltage sensing module 440. The secondary voltage sensing module 440 may comprise a sensor 441, a measuring unit 442, a battery 443, a control unit 444, a memory unit 445 and an interface unit 446. The interface unit 446 may comprise a GNSS interface apparatus 447, a radio frequency (RF) interface apparatus 448 and a WiFi apparatus 449. The GNSS interface apparatus 437 may be configured to receive the GNSS data, including the time stamp data. The measuring unit 442 may be configured to obtain analogue voltage data from the sensor 441 and digitize the data to produce (digitized) voltage data. The control unit 444 may be configured to ensure that each (digitized) voltage data is attributed with the time-stamp provided via the GNSS interface apparatus 447. The RF interface apparatus 448 may be configured to receive the time-stamped voltage data from the primary voltage sensing module 430.

The control unit 444 of the secondary voltage sensing module 440 may be configured to aggregate the time-stamped voltage data provided by the primary voltage sensing module 430 with the time stamped voltage data provided by the secondary voltage sensing module 440.

The aggregated data may be onwardly transmitted via the WiFi apparatus 449 (for example to the user's mobile device 370) for onward transmission to the cloud or may be onwardly transmitted via the RF interface apparatus 448 directly to the cloud without going via the user's mobile device 370. The WiFi apparatus 449 may be configured to receive data from the user's mobile device 370.

Figure 6:
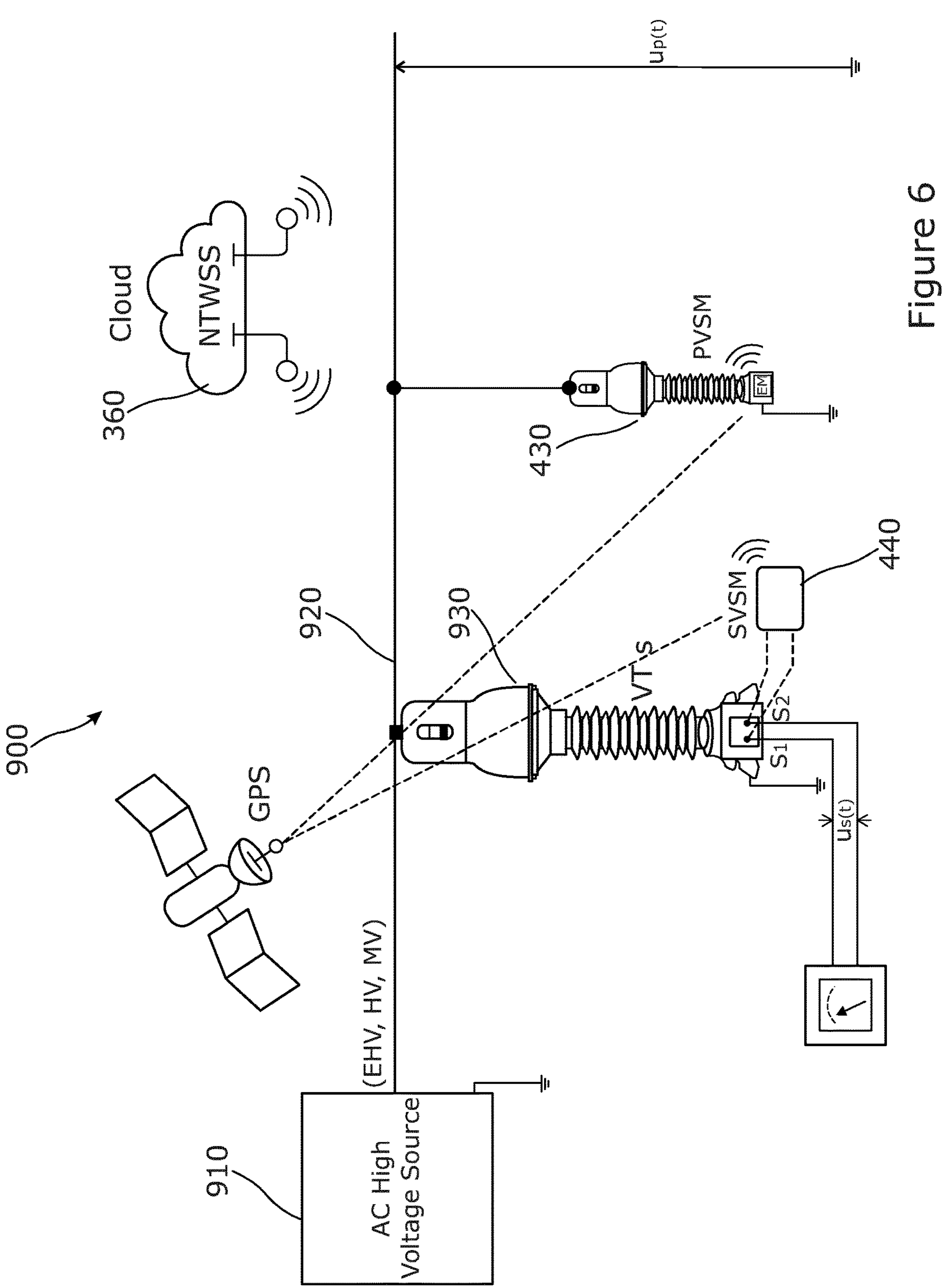
FIG. 6 shows a simplified electrical scheme by which calibration data for the pair of primary and secondary sensing modules may be obtained.

FIG. 6 shows a calibration rig that may be used to calibrate a pair of primary and secondary voltage sensing modules 430, 440. Given the high degree of precision required of the testing method, it is necessary to ensure that the sensing apparatus is correctly calibrated.

The calibration circuit 900 comprises an AC high voltage source 910 and a high voltage conductor 920 comprising a standard high voltage transformer (VTs) 930 having a transformation ratio $K_n$. The calibration process requires the primary voltage sensing module 430 to sense the voltage at the high voltage conductor 920 and requires the secondary voltage sensing module 440 to be used simultaneously to sense the voltage at the low voltage side of the standard high voltage transformer 930.

The standard high voltage transformer VTs 930 is selected for having the same rated ratio, $K_n$, as the rated ratio Knvtx of the transformer VTx 400 to be tested. However, the standard high voltage transformer VTs 930 is selected for its minor ratio and phase displacement errors, with accuracy class at least 0.05%. Thus, when the calibration is performed, errors in the sensing are attributed to the primary voltage sensing module 430 and the secondary voltage sensing module 440, rather than to the standard high voltage transformer VTs 930. The errors determined in this way are transmitted to a Software Error Compensation and Correction (SECC) block which may be located in the cloud 160, as shown in FIG. 1.

Then, when the primary voltage sensing module 430 and the secondary voltage sensing module 440 are used to test a voltage transformer (VTx) in real operating conditions, the errors derived from the calibration process in respect of the primary voltage sensing module 430 and the secondary voltage sensing module 440 are effectively removed by the SECC from the measured data in order to provide a high degree of accuracy in measuring the ratio and phase displacement errors of the VTx 400.

In more detail, the calibration process involves obtaining a series of timestamped upstream voltage data points and a series of timestamped downstream voltage data points for VTs so as to populate a calibration table (LUT-look up table) comprising rows and columns.

The number of columns may be equal to the number of calibration points derived during the calibration process, wherein each calibration point may be at a different relative voltage in accordance with the voltage supplied by the AC high voltage source 910. Each calibration point K, from the first (1) to the last (n) contains three data points: relative voltage at calibrated point k ($u_k$), ratio error of the system at calibration point k ($\varepsilon_k$), phase displacement error of the system at calibration point k ($\varphi$k), respectively for each $k \in (1, n)$. In this way, a set of calibration values ($u_k$, $\varepsilon_k$, $\varphi_k$) is formed.

The number of calibration points (n) and the values of relative voltages ($u_k$) may be arbitrarily chosen. Preferred values for n may be n=5, 10, 15, respectively, and $u_k$ values are minimum 0.1 and maximal 1.2 of the rated primary voltage.

Once the primary voltage sensing module 430 and the secondary voltage sensing module 440 are in their respective positions on either side of the voltage transformer VTx 400 under test, the timestamped upstream and downstream voltage data points are derived from the primary voltage sensing module 430 and the secondary voltage sensing module 440, and the measured ratio error and phase displacement error and relative voltage are calculated using the uncompensated values.

Next, the calibration data derived via the calibration process is used to remove the known errors.

In this way, highly accurate ratio and phase displacement errors for the voltage transformer under test may be obtained.

Examples of measured results for relative voltage, ratio and phase displacement error (with the known measurement errors derived from the calibration data removed) for an example voltage transformer VTx under test are shown in Table 1:

TABLE 1

| u [r.u.] | $\varepsilon_{VTx}$ [%] | $\varphi_{VTx}$ [min] |
|---|---|---|
| 0.98 | 0.24 | 21.3 |
| 0.99 | 0.24 | 20.7 |
| 0.98 | 0.23 | 19.9 |
| 0.99 | 0.23 | 21.1 |
| 0.98 | 0.24 | 22.0 |

Measured data from the secondary voltage sensing module 440 may be encrypted by the secondary voltage sensing module 440, transmitted to the app 150 of a user's mobile device 370. They may then be processed further using the cloud platform 160, and may then subsequently be made available to the user 170 from the cloud 160.

After the test has been carried out, primary voltage sensing module 430 and the secondary voltage sensing module 440 may be disconnected from the energized conductors, and the same primary voltage sensing module 430 and the secondary voltage sensing module 440 can be used to repeat the procedure on other voltage transformers of the same transformation ratio.

An example of a calibration table with five calibration points is provided in Table 2:

TABLE 2

| $u_k$ [r.u.] | $u_s$ [V] | $\varepsilon_k$ [%] | $\varphi_k$ [min] |
|---|---|---|---|
| 0.50 | 50 | 0.19 | −8.2 |
| 0.60 | 60 | 0.23 | −14.8 |
| 0.80 | 80 | 0.31 | −22.6 |
| 1.00 | 100 | 0.35 | −27.5 |
| 1.20 | 120 | 0.39 | −29 |

What follows is an explanation of how the calibration values may be used by the Software Error Compensation and Correction (SECC) to compensate for and correct for the known errors.

Figure 8A:
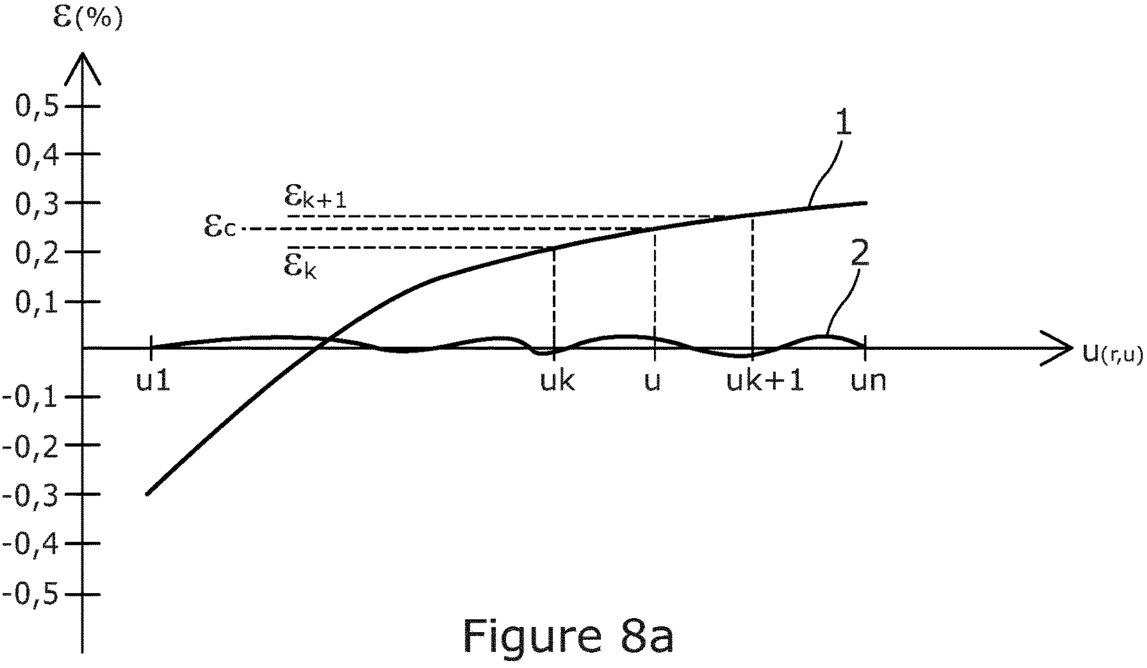
FIGS. 8*a* and 8*b* show calibration curves for ratio error and phase displacement error derived from a particular pair of primary and secondary sensing modules.
Figure 8B:
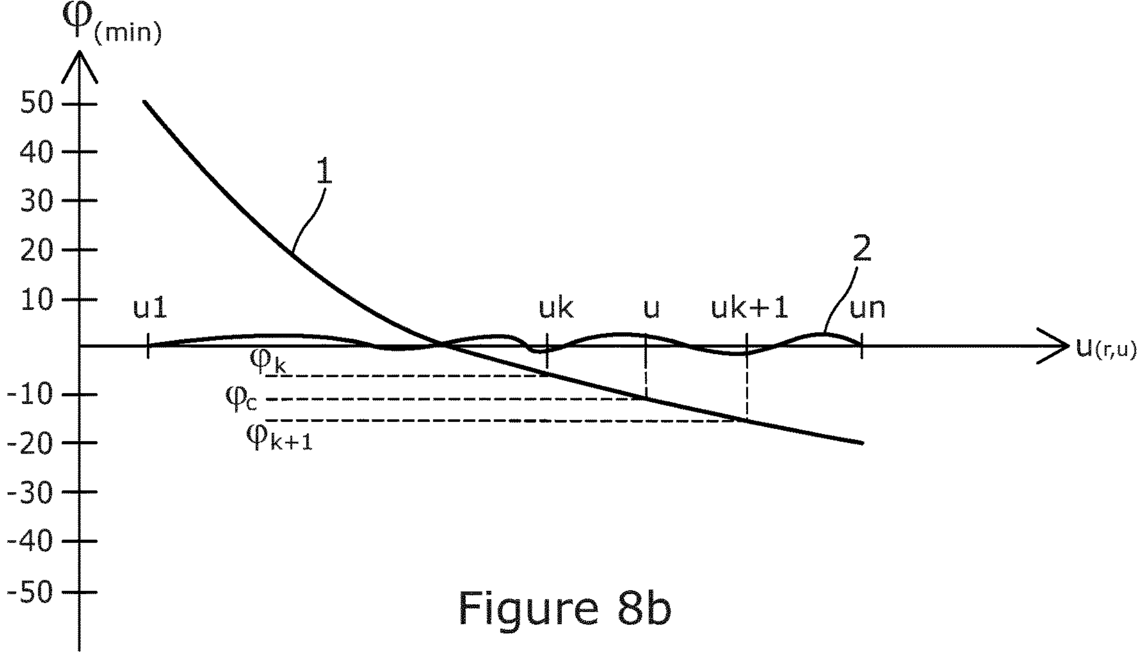

Compensation values $\varepsilon_c$ and $\varphi_c$ for an arbitrary relative value of the primary voltage (u=Up/Upn) are determined on the basis of a linear interpolation between two known successive calibration points from the calibration table (k and k+1) as shown on FIGS. 8*a* and 8*b*.

The real relative value of the primary voltage (u=Up/Upn) may be $u_{k+1} \geq u \geq u_k$, where k is k-th calibration point.

Using linear interpolation as shown in FIGS. 8*a* and 8*b*, $\varepsilon_c$ and $\varphi_c$ are calculated as follows:

$$\text{for } u_{k+1} > u > u_k;\ \varepsilon_c = \varepsilon_k + \frac{\varepsilon_{k+1} - \varepsilon_k}{u_{k+1} - u_k}(u - u_k);$$

$$\varphi_c = \varphi_k + \frac{\varphi_{k+1} - \varphi_k}{u_{k+1} - u_k}(u - u_k);$$

$$\text{for } u = u_k;\ \varepsilon_c = \varepsilon_k;\ \varphi_c = \varphi_k,$$

$$\text{for } u = u_{k+1},\ \varepsilon_c = \varepsilon_{k+1};\ \varphi_c = \varphi_{k+1}$$

If $u<u_1$ linear extrapolation uses calibration points $u_1$ and $u_2$.

If $u>u_n$ linear extrapolation uses calibration points $u_{n-1}$ and $u_n$.

$$\varepsilon_{ctx} = \varepsilon_m - \varepsilon_c$$

$$\varphi_{ctx} = \varphi_m - \varphi_c$$

An exemplary data set for results of SECC is shown in Table 3:

TABLE 3

| u [r.u.] | $U_s$ [V] | $\varepsilon_m$ [%] | $\varphi_m$ [min] | $\varepsilon_c$ [%] | $\varphi_c$ [min] | $\varepsilon_{VTx}$ [%] | $\varphi_{VTx}$ [min] |
|---|---|---|---|---|---|---|---|
| 0.55 | 55 | 0.22 | −12.6 | 0.21 | −11.5 | 0.01 | −1.1 |
| 0.7 | 70 | 0.283 | −19.12 | 0.27 | −18.7 | 0.013 | −0.42 |
| 1.1 | 110 | 0.42 | −29.85 | 0.37 | −29 | 0.05 | −0.85 |

where:

$\varepsilon_m$ and $\varphi_m$—measured values of ratio and phase displacement error, $\varepsilon_c$ and $\varphi_c$—compensation values of ratio and phase displacement error, $\varepsilon_{VTx}$ and $\varphi_{VTx}$—values of ratio and phase displacement error of voltage transformer under test.

In FIG. 8*a*, curve 1 represents the ratio error of the test system before calibration and curve 2 represents ratio error of the test system after calibration as a function of relative voltage.

In FIG. 8*b*, curve 1 represents the phase displacement error of the test system before calibration and curve 2 represents phase displacement error of the test system after calibration as a function of relative voltage.

The authors have demonstrated through a large number of experiments that the proposed methodology of calibration and correction improves the accuracy of the test system for the entire order of magnitude.

In one exemplary configuration, a test is performed on a high voltage (110 kV) voltage transformer VTx that is configured to transform 110 kV to 100 V. In this case, a primary voltage sensing module 430 is selected appropriate to sense the high voltage of 110 kV on a high voltage side of the voltage transformer VTx 400 under test and a secondary voltage sensing module 440 is selected appropriate to sense 100 V on a low voltage side of the voltage transformer under test.

In one example, the sensor in the primary voltage sensing module 430 may be a low power inductive high voltage transformer 110 kV to 100 V, accuracy class 0.05 as defined in IEC 61869 and the sensor in the secondary voltage sensing module may be a low power inductive low voltage transformer 100 V to 1 V accuracy class 0.05 as also defined in IEC 61869. In this scenario, a user would select the measurement parameter input data via the mobile device 370, wherein $Kn_{VTx}$=110,000 V/100 V and $K_p$=110,000 V/100 V.

Calibration 120 is carried out using the selected voltage primary and secondary sensing module on the calibration circuit shown in FIG. 6, with standard high voltage transformer Kn=110,000 V/100 V.

The FIG. 6 arrangement has negligible ratio and phase displacement errors so $\varepsilon_{vtx} \approx 0$ and $\varphi_{vtx} \approx 0$ so, in calibration points, $\varepsilon_k \approx \varepsilon_m$ and $\varphi_k \approx \varphi_m$.

Using the AC high voltage source 910, the relative voltage $u_k$ is adjusted. For example, for the first calibration point the relative voltage $u_k$=0.5 r.u. may be adjusted and the ratio error and the phase displacement error are measured as $\varepsilon_k$=0.19% and $\varphi_k$=−8.2 min. For the last calibration point, $u_k$=1.2 r.u. is adjusted and the ratio error and the phase displacement error are measured as $\varepsilon_k$=0.39% and $\varphi_k$=−29 min. (The full data are shown in Table 2 above.)

It should be noted that the calibration need not be carried out immediately before a test. Indeed, it may be carried out only infrequently.

Following calibration (where performed), the primary and secondary voltage sensing modules are removed from the calibration circuit and applied to the voltage transformer under test, in accordance with the arrangement shown in FIG. 3. Using a so-called hot stick principle, the primary voltage sensing module 430 is mounted on high voltage energized conductor 410, and the secondary voltage sensing module is mounted on low voltage energized conductor 420.

Figure 7:
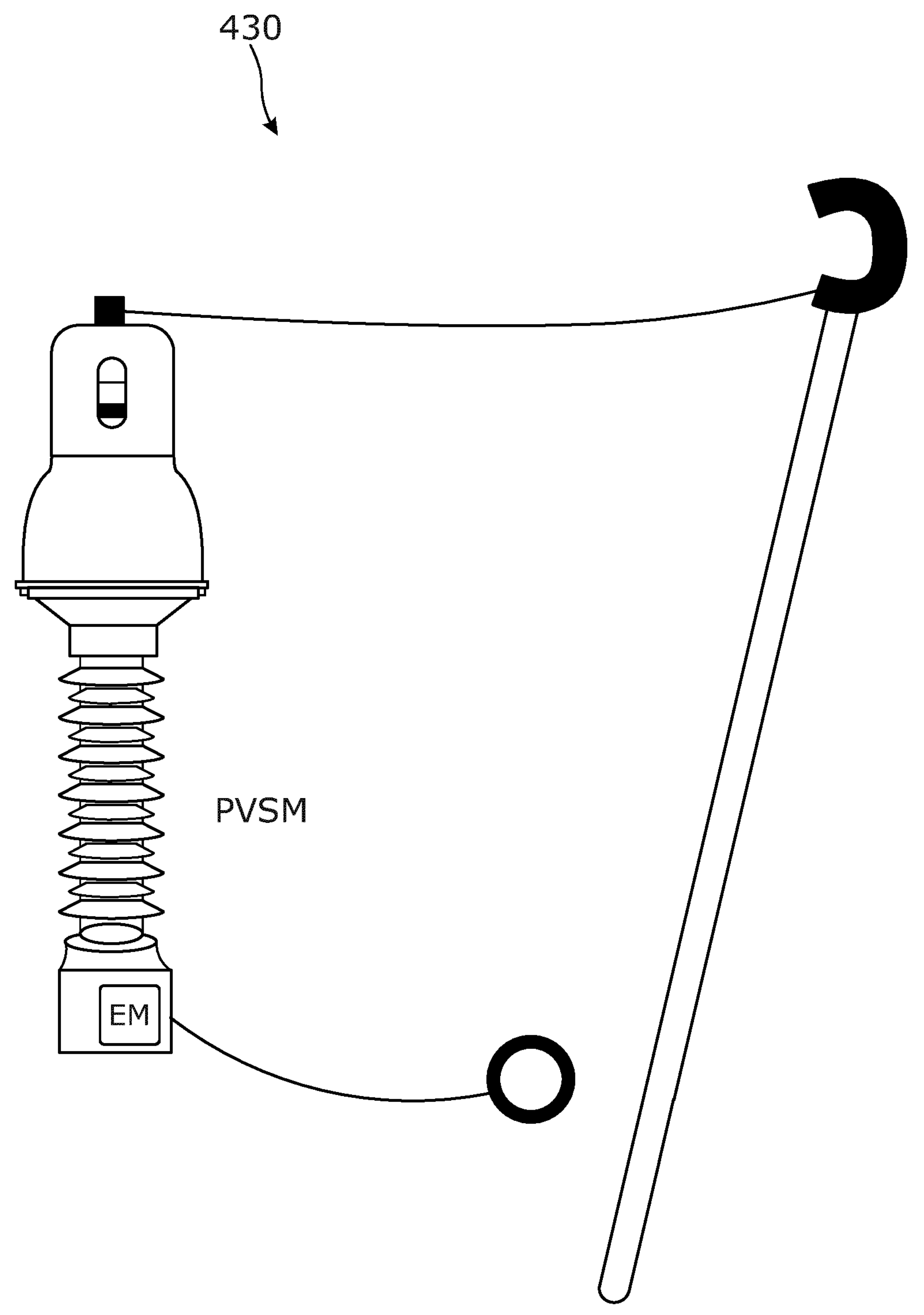
FIG. 7 shows the primary sensing module of FIG. 4 in a less schematic representation.

FIG. 7 shows an example embodiment of the primary voltage sensing module 430 including a hot stick mounting rod for connecting one side of the primary voltage sensing module 430 to the high voltage energized conductor 410.

The invention claimed is:

1. An online live line method of analysing metrological properties of a high voltage voltage transformer configured to transform an upstream voltage into a downstream voltage, the method comprising:

obtaining a series of upstream voltage data points during a first time period using an upstream voltage sensor;

attributing an upstream time stamp provided by an upstream global navigation satellite system (GNSS) signal receiver to each one of the series of upstream voltage data points to obtain a time-stamped series of upstream voltage data points;

obtaining a series of downstream voltage data points during the first time period using a downstream voltage sensor;

attributing a downstream time stamp provided by a downstream global navigation satellite system (GNSS) signal receiver to each one of the series of downstream voltage data points to obtain a time-stamped series of downstream voltage data points;

calculating a voltage transformer phase displacement error between the time-stamped series of upstream voltage data points and the time-stamped series of downstream voltage data points;

calculating a voltage transformer ratio error by comparing a rated ratio of the voltage transformer with a measured ratio determined using the time-stamped series of upstream voltage data points and the time-stamped series of downstream voltage data points.

2. The method of claim 1 wherein the measured ratio is a ratio of:

a root mean square value of the series of upstream data points; to a root mean square value of the series of downstream data points.

3. The method of claim 1 wherein the voltage transformer phase displacement error is proportional to a time difference between at least one pair of successive zero crossings of time stamped upstream voltage data and time stamped downstream voltage data, wherein accuracy of time reference is less than 100 nanoseconds and preferably approximately 10 nanoseconds.

4. The method claim 1 wherein each of the stream of upstream voltage data points and the stream of downstream voltage data points comprises at least 20,000 data points per AC cycle, preferably 40,000 data points per AC cycle.

5. The method of claim 1 further comprising compensating for measurement errors derived via a calibration process.

6. The method of claim 5 wherein the calibration process comprises:

using the upstream voltage sensor to sense a voltage at high voltage conductor of a calibration circuit;

using the downstream voltage sensor to a sense a voltage at low voltage side of the calibration circuit, wherein the calibration circuit comprises a standard high voltage transformer with a transformation ratio accuracy rating of at least ±0.05%;

thereby to determine ratio error and phase displacement error arising from the pairing of the upstream and downstream voltage sensors.

7. The method of claim 5 further comprising a step of removing error values determined via the calibration process from measured data of the voltage transformer under test in order to achieve corrected data values, wherein optionally the step of removing error values is carried out by a cloud server.

8. The method of claim 1 further comprising one or both of:

hot stick mounting the upstream voltage sensor on an upstream conductor upstream of the voltage transformer, including the provision of electro-magnetic shielding to protect the upstream voltage sensor;

hot stick mounting the downstream voltage sensor on a downstream conductor downstream of the voltage transformer, including the provision of electro-magnetic shielding to protect the downstream voltage sensor.

9. An electrical measurement apparatus for online live line analysis of metrological properties of a voltage transformer, the apparatus comprising:

a primary sensing module comprising:

a primary sensor configured to measure a primary voltage at a first conductor on a first side of a voltage transformer in order to obtain a series of primary voltage data points; and a primary global navigation satellite system (GNSS) signal receiver configured to attribute a primary GNSS time stamp to each one of the series of primary voltage data points to obtain a primary series of time stamped data points; and a secondary sensing module comprising:

a secondary sensor configured to measure a secondary voltage at a second conductor on a second side of the voltage transformer in order to obtain a series of secondary voltage data points; and a secondary GNSS signal receiver configured to attribute a secondary GNSS time stamp to each one of the series of secondary voltage data points to obtain a secondary series of time stamped data points;

wherein the primary sensing module is configured to transmit the primary series of time stamped data points to the secondary sensing module; and wherein the secondary sensing module is configured:

to receive the primary series of time stamped data points;

to generate aggregated data comprising both the primary series of time-stamped data points and the secondary series of time-stamped voltage data points; and to output the aggregated data.

10. The measurement apparatus of claim 9 wherein the primary sensing module is configured to be hot stick mounted on an energized high voltage conductor, to sense a higher voltage than the secondary sensing module.

11. The measurement apparatus of claim 9 wherein the primary sensing module comprises electromagnetic shielding and wherein, optionally, the secondary sensing module comprises electromagnetic shielding.

12. The measurement apparatus of claim 9 wherein:

the primary sensing module comprises a primary wireless transmitter configured to transmit the primary series of time stamped data points to the secondary sensing module; and the secondary sensing module comprises a secondary wireless receiver configured to receive the primary series of time stamped data points from the secondary sensing module.

13. The measurement apparatus of claim 9 wherein:

the secondary sensing module comprises a secondary wireless transmitter configured to transmit the aggregated data and/or to transmit the ratio error and the phase displacement error.

* * * * *